United States Patent
Landru et al.

(10) Patent No.: US 9,659,777 B2
(45) Date of Patent: May 23, 2017

(54) PROCESS FOR STABILIZING A BONDING INTERFACE, LOCATED WITHIN A STRUCTURE WHICH COMPRISES AN OXIDE LAYER AND STRUCTURE OBTAINED

(71) Applicant: Soitec, Crolles (FR)

(72) Inventors: Didier Landru, Champ des Froges (FR); Carole David, Crolles (FR); Ionut Radu, Crolles (FR); Lucianna Capello, Grenoble (FR); Yann Sinquin, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/362,208

(22) PCT Filed: Dec. 13, 2012

(86) PCT No.: PCT/IB2012/002698
§ 371 (c)(1),
(2) Date: Jun. 2, 2014

(87) PCT Pub. No.: WO2013/088226
PCT Pub. Date: Jun. 20, 2013

(65) Prior Publication Data
US 2014/0357093 A1    Dec. 4, 2014

(30) Foreign Application Priority Data

Dec. 13, 2011   (FR) .................................. 11 61527

(51) Int. Cl.
*H01L 21/428*   (2006.01)
*H01L 21/268*   (2006.01)
(Continued)

(52) U.S. Cl.
CPC ...... *H01L 21/268* (2013.01); *H01L 21/02354* (2013.01); *H01L 21/2007* (2013.01); *H01L 21/324* (2013.01); *H01L 21/428* (2013.01)

(58) Field of Classification Search
CPC ... H01L 21/268; H01L 21/324; H01L 21/275; H01L 21/02354; H01L 21/02686; H01L 21/2007; H01L 21/428; H01L 21/76251
(Continued)

(56) References Cited

U.S. PATENT DOCUMENTS

| | | | |
|---|---|---|---|
| 6,403,450 B1 * | 6/2002 | Maleville et al. | ............ 438/471 |
| 7,575,988 B2 * | 8/2009 | Bourdelle | ............. H01L 21/187 |
| | | | 257/E21.088 |

(Continued)

FOREIGN PATENT DOCUMENTS

| | | |
|---|---|---|
| CN | 100399511 | 7/2008 |
| CN | 101728312 | 6/2010 |

(Continued)

OTHER PUBLICATIONS

International Search Report for International Application No. PCT/IB2012/002698 dated Mar. 3, 2013, 3 pages.
(Continued)

*Primary Examiner* — Stephen W Smoot
(74) *Attorney, Agent, or Firm* — TraskBritt

(57) ABSTRACT

The invention relates to a process for stabilizing a bonding interface, located within a structure for applications in the fields of electronics, optics and/or optoelectronics and that comprises an oxide layer buried between an active layer and a receiver substrate, the bonding interface having been obtained by molecular adhesion. In accordance with the invention, the process further comprises irradiating this structure with a light energy flux provided by a laser, so that the flux, directed toward the structure, is absorbed by the
(Continued)

energy conversion layer and converted to heat in this layer, and in that this heat diffuses into the structure toward the bonding interface, so as to thus stabilize the bonding interface.

15 Claims, 3 Drawing Sheets

(51) Int. Cl.
H01L 21/02 (2006.01)
H01L 21/20 (2006.01)
H01L 21/324 (2006.01)

(58) Field of Classification Search
USPC .................................................. 438/799, 535
See application file for complete search history.

(56) References Cited

U.S. PATENT DOCUMENTS

| | | | | |
|---|---|---|---|---|
| 2009/0029525 | A1* | 1/2009 | Ohnuma | H01L 21/76254 438/458 |
| 2010/0304151 | A1 | 12/2010 | Tuennermann et al. | |
| 2011/0019278 | A1* | 1/2011 | Aoki | G02B 5/223 359/585 |
| 2013/0026663 | A1* | 1/2013 | Radu et al. | 257/798 |
| 2013/0140064 | A1* | 6/2013 | Burberry | H01L 21/02642 174/256 |

FOREIGN PATENT DOCUMENTS

| | | |
|---|---|---|
| EP | 232935 A1 | 8/1987 |
| EP | 0843346 | 5/1998 |
| JP | 2010161359 | 7/2010 |
| NL | EP 0 232 935 A1 * | 8/1987 ............. H01L 21/18 |

OTHER PUBLICATIONS

Jenkins, Margaret Wright, A New Preferential Etch for Defects in Silicon Crystals, Journal of the Electrochemical Society, vol. 124, No. 5, (1977), pp. 757-759.
Witte et al., Laser Joining of Glass with Silicon, Proceedings of SPIE, vol. 4637, vol. 21, Jan. 21, 2002, pp. 487-495.
International Written Opinion for International Application No. PCT/IB2012/002698 dated Mar. 13, 2013, 4 pages.
International Preliminary Report on Patentability for International Application No. PCT/IB2012/002698 dated Jun. 17, 2014, 5 pages.

* cited by examiner

PROCESS FOR STABILIZING A BONDING INTERFACE, LOCATED WITHIN A STRUCTURE WHICH COMPRISES AN OXIDE LAYER AND STRUCTURE OBTAINED

CROSS-REFERENCE TO RELATED APPLICATIONS

This application is a national phase entry under 35 U.S.C. §371 of International Patent Application PCT/IB2012/002698, filed Dec. 13, 2012, designating the United States of America and published in English as International Patent Publication WO 2013/088226 A1 on Jun. 20, 2013, which claims the benefit under Article 8 of the Patent Cooperation Treaty and under 35 U.S.C. §119(e) to French Patent Application Serial No. 1161527, filed Dec. 13, 2011, the disclosure of each of which is hereby incorporated herein in its entirety by this reference.

TECHNICAL FIELD

The invention lies in the field of the manufacture of structures for applications in the field of electronics, optics and/or optoelectronics.

The present invention relates more specifically to a process for stabilizing a bonding interface, located within such a structure, which comprises an oxide layer buried between an active layer and a receiver substrate, the bonding interface having been obtained by molecular adhesion.

BACKGROUND

The production of the aforementioned multilayer structures generally requires the use of processes for bonding and transferring layer(s) between various wafers or substrates.

Among the various bonding processes, one of them, known as "molecular bonding adhesion," consists of putting the surfaces to be bonded directly into intimate contact, without any additional material being placed between these surfaces. In such a case, it is said that the bonding takes place by "molecular adhesion" between the two surfaces.

This process makes it possible, in particular, to advantageously produce structures known under the acronym "SeOI" (which stands for "Semiconductor On Insulator"), in which an insulating layer, generally an oxide, is inserted between a thin film of semiconductor material and a receiver substrate or similar structures, known under the acronym "SOI," in which the thin film is made of silicon.

It also makes it possible to produce structures known under the acronym "SOI UTBOX" (which stands for "Silicon On Insulator Ultra Thin Buried Oxide"), in which an oxide layer having a thickness of less than or equal to 50 nm (50 nanometers), or even less than or equal to 20 nm and greater than 1 nm is buried between a layer of silicon and a receiver substrate.

Such SeOI, SOI or SOI UTBOX structures may, for example, be manufactured by bonding a layer of semiconductor material (for example, silicon) from a donor substrate, onto a receiver substrate covered with an oxide layer and by transferring it to this oxide layer by then detaching the donor substrate. The structure obtained has a bonding interface between an oxide layer and a layer of semiconductor material.

However, in order to prevent the appearance of hydrogen blisters during the detachment annealing, especially in the case of SOI UTBOX, these structures are advantageously manufactured by bonding of a donor substrate covered with an oxide layer to a receiver substrate also covered with an oxide layer. Once bonded, the two oxide layers form only one layer.

However, after the finishing treatments carried out on the SOI UTBOX structure thus obtained, an incomplete stabilization (or strengthening) of the oxide/oxide bonding interface was observed, probably due to the trapping of water at this interface.

This incomplete stabilization is capable of interfering with the performances of the electronic devices or components that will be manufactured from these structures and that will include the ultra thin buried oxide layer.

However, for certain applications, the buried oxide (BOX) layer plays a significant electrical role (for example, in architectures of the "ground plane" or "back gate" type).

Any defect capable of impairing the electrical properties of the BOX, especially the charge density at the interface known to a person skilled in the art under the abbreviation "Dit," and the charge of the oxide known under the abbreviation "Qbox," or of compromising its homogeneity, may then prove very damaging.

In order to ensure satisfactory and reproducible electrical performances, it is necessary to complete the stabilization of the bonding interface, whether it is formed between two oxide layers or between one oxide layer and one silicon layer.

Stabilization is a microscopic phenomenon that reflects the establishment of atomic bonds (covalent bonds) between the two bonded layers, this being homogeneous over the whole of the bonding interface.

The treatments known from the prior art for SOI substrates consist of applying a stabilization annealing carried out at a temperature above 1100° C. for several hours.

Such an annealing lengthens and complicates the manufacturing process and increases its costs. Moreover, such an annealing is capable of degrading the quality of the thin film of the substrate. Indeed, beyond 1000° C., defects known as "slip lines" may be generated due to the appearance of localized stress zones at the points of contact between the substrate and the device intended to support it in the furnace.

Moreover, in some heterostructures comprising materials with different substrates having different thermal expansion coefficients (CTEs), such as silicon-on-sapphire (SOS), the molecular bonding adhesion between the oxide SOI layer and the sapphire layer is not strong enough to ensure good quality of the final layer transfer, especially during a thermal stabilization step. This step is necessary to ensure a bonding energy sufficiently strong over the entire surface of the plate in such a way in order to perform a grinding step. The thermal stabilization requires submission of the two bonded substrates to a rising temperature (100° C. to 180° C.). Because of their different CTE, the rising temperature causes a strong curvature of the bonding and a stress at the bonding interface, which is mainly focused on the edge of the bonded area for substrates having a circular shape. This accumulation of stress causes separations of the bonded substrates, quality degradations of the transfer and defects.

The objective of the invention is, therefore, to provide a process for stabilizing a bonding interface by molecular adhesion, which does not exhibit the aforementioned drawbacks of the prior art.

For this purpose, the invention relates to a process for stabilizing a bonding interface, located within a structure for applications in the fields of electronics, optics and/or optoelectronics, which comprises an oxide layer buried between an active layer and a receiver substrate, the bonding interface having been obtained by molecular adhesion.

In accordance with the invention, the process comprises irradiating this structure with a light energy flux provided by a laser, so that the flux, directed toward the structure, is absorbed by the energy conversion layer and converted to heat in this layer, and in that this heat diffuses into the structure toward the bonding interface, so as to thus stabilize the bonding interface.

According to the invention, the energy conversion layer can be formed on and/or in the active layer, but also can be the active layer.

According to other advantageous and non-limiting features of the invention, taken alone or in combination:
- the fluence of the laser and the material constituting the energy conversion layer are chosen so as to bring the buried oxide layer to a temperature above 1200° C.;
- the material constituting the energy conversion layer has a thermal conductivity of less than 20 W/m·K;
- the bonding interface extends either between two oxide layers that, taken together, constitute the buried oxide layer, or between the buried oxide layer and the active layer, or between the buried oxide layer and the receiver substrate;
- the irradiation of the structure is carried out by exposing the free surface of the receiver substrate, referred to as the "back face," to the light energy flux, the material constituting this receiver substrate being transparent in the range of wavelengths of the light energy flux;
- the irradiation can be located on a specific location, for example, the edges of the energy conversion layer;
- the receiver substrate is made of silicon;
- the receiver substrate is made from a material chosen from sapphire, aluminum oxide ($Al_2O_3$), aluminum nitride (AlN), silicon carbide (SiC) and quartz;
- the laser is an infrared laser, the wavelength of which is greater than 9 μm;
- the laser is a pulsed $CO_2$ laser;
- the buried oxide layer has a thickness of less than 50 nm, preferably between 1 nm and 50 nm;
- the material constituting the active layer is a semiconductor material;
- the semiconductor material is silicon;
- the oxide constituting the buried oxide layer is chosen from silicon oxide ($SiO_2$), aluminum oxide ($Al_2O_3$) and hafnium oxide ($HfO_2$);
- the energy conversion layer is made from a material chosen from silicon oxide ($SiO_2$) and silicon nitride ($Si_3N_4$);
- the energy conversion layer is made from silicon oxide ($SiO_2$) and the stabilization treatment is followed by a step of removing this energy conversion layer.

BRIEF DESCRIPTION OF THE DRAWINGS

Other features and advantages of the invention will become apparent from the description that will now be given, with reference to the accompanying drawings, which represent therein, by way of example and nonlimitingly, one possible embodiment.

In these drawings.

DETAILED DESCRIPTION

One possible embodiment of a multilayer structure, to which the stabilization process in accordance with the invention may be applied, will now be described with reference to FIGS. 1 and 2.

Figure 1:
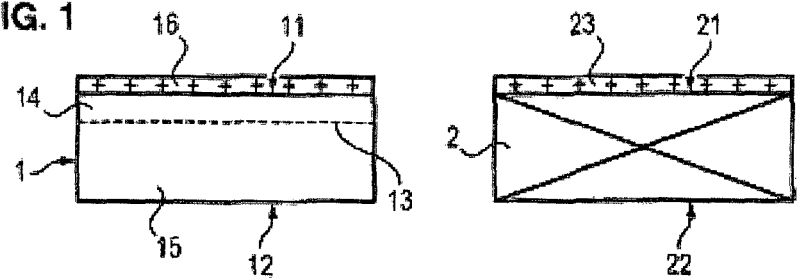
FIGS. 1 and 2 schematically represent the various successive steps of one embodiment of a process for manufacturing a multilayer structure.
Figure 2:
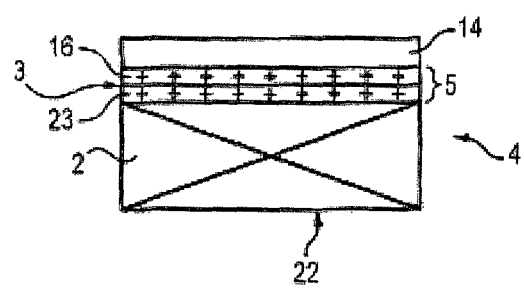

In FIG. 1, a donor substrate 1 can be seen, which has a front face 11 and an opposite back face 12.

Donor substrate 1 is preferably made from a semiconductor material, for example, made of silicon, germanium, silicon/germanium (SiGe) or of gallium nitride (GaN).

It has, in the vicinity of its front face 11, a zone of weakness 13 that delimits, with the front face 11, an active layer 14. The remainder of substrate 1 bears the reference 15.

This zone of weakness 13 is preferably formed by implantation of atomic species through the substrate 1, for example, according to the technique known to a person skilled, in the art under the trademark SMART CUT®.

The substrate 1 may be a single-layer or multilayer substrate.

Moreover, its front face 11 is covered with a layer of oxide 16, for example, of silicon oxide ($SiO_2$), aluminum oxide ($Al_2O_3$) or hafnium oxide ($HfO_2$). The layer 16 could also be comprised of a stack of several layers of these oxides, preferably deposited one on top of the other.

In FIG. 1, a receiver substrate 2 may also be seen, which has a front face 21 and an opposite back face 22.

The front face 21 is covered with a layer of oxide 23, for example, of silicon oxide ($SiO_2$), aluminum oxide ($Al_2O_3$) or hafnium oxide ($HfO_2$). The layer 23 could also be comprised of a stack of several layers of these oxides.

It will be noted that the receiver substrate 2 may be a single-layer or multilayer substrate.

The donor substrate 1 and the receiver substrate 2 are then bonded to one another, via molecular adhesion, so that their respective oxide layers 16 and 23 come into contact with one another.

The oxide layers 16 and 23 may be of the same chemical nature (same oxide) or of different nature and may be of the same thicknesses or of different thicknesses.

The bonding interface between the two substrates 1, 2 bears the reference 3.

The remainder 15 of the donor substrate 1 is then detached along the zone of weakness 13, in a manner known to a person skilled in the art, via application of mechanical and/or chemical and/or thermal stresses.

A material-on-insulator structure is then obtained, referenced 4, which successively comprises the receiver substrate 2, two oxide layers 16 and 23 and finally the active layer 14

(see FIG. 2) and even a semiconductor-on-insulator (SeOI) structure 4 is obtained when the active layer 14 is made of a semiconductor material.

The active layer 14 is thus named because it is in this active layer or on this active layer that the electronic, optical or optoelectronic components will be subsequently manufactured.

The two superposed oxide layers 16 and 23 together form a "buried" oxide layer, which bears the general reference 5.

Figure 3:
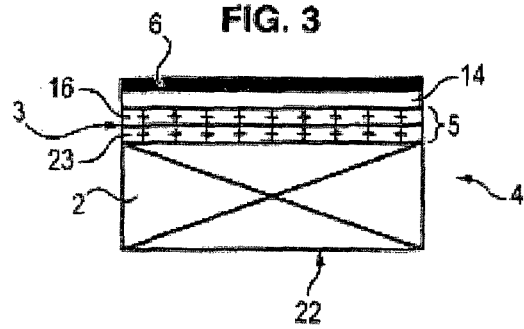
FIGS. 3 and 4 schematically represent the various steps of the process for stabilizing a bonding interface in accordance with the invention, applied to the multilayer structure, in which the bonding interface extends between two oxide layers.

Structure 4 is then subjected to a process for stabilizing the bonding interface 3 in accordance with the invention, the first step of which is represented in FIG. 3.

This step comprises forming on and/or in the active layer 14 an "energy conversion" layer 6.

Figure 4:
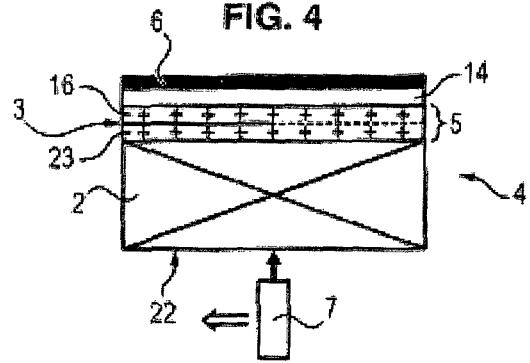

The next step of the process, represented in FIG. 4, comprises irradiating the structure 4, with a light energy flux, provided by a laser 7, so as to stabilize the bonding interface 3.

Figure 5:
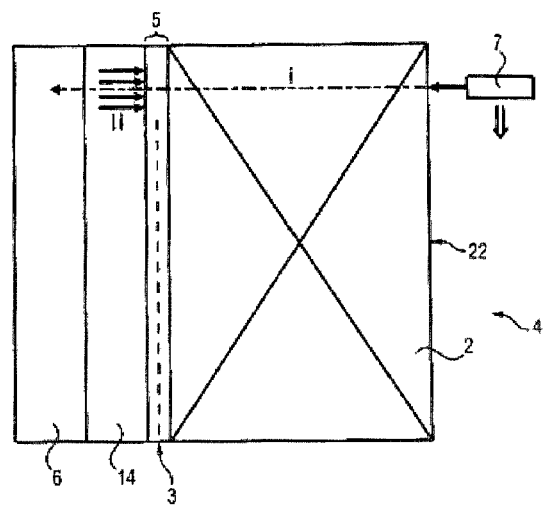
FIG. 5 is a diagram, on an enlarged scale, representing the structure during the application of the stabilization process in accordance with the invention.

The phenomenon of stabilizing the bonding interface 3 will now be explained in connection with FIG. 5.

Preferably, the laser 7 is moved so as to sweep the whole of the free surface of the receiver substrate 2, that is to say, its back face 22. The light energy provided by the laser 7 passes through the receiver substrate 2, the buried oxide layer 5, the active layer 14, and is absorbed by the energy conversion layer 6 (the route is marked by the arrow i). The laser 7 passes through the buried oxide layer 5 without being absorbed because the latter is too thin, as will be explained later.

The laser 7 thus makes it possible to obtain strong and rapid heating of the energy conversion layer 6.

Generally, the choice of a laser is dictated by the power to be provided and the nature of the materials constituting the receiver substrate 2, the active layer 14 and the energy conversion layer 6, as is explained below.

The laser 7 is preferably an infrared laser, the wavelength of which is greater than 9 µm.

In the case where the receiver substrate 2 is made of silicon, it is preferably a pulsed $CO_2$ laser.

The pulses used are preferably short. By way of illustrative example, for pulses of less than 1 µs, the power density required is of the order of $10^4$ to $10^5$ W/cm$^2$. For pulses of less than 1 ns, the power density is of the order of $10^8$ W/cm$^2$.

The material constituting the receiver substrate 2 is, therefore, chosen so as to be transparent in the range of wavelengths of the laser 7. It may be, for example, either silicon as mentioned previously, or sapphire, quartz, aluminum nitride (AlN), aluminum oxide ($Al_2O_3$) or silicon carbide (SiC).

The material constituting the energy conversion layer 6 is chosen so as to absorb the energy in the range of wavelengths provided by the laser 7 and so as to conduct very little or no heat. In other words, its thermal conductivity is preferably less than 20 W/m·K.

By illuminating the structure 4 via its back face 22, it is the buried part of the energy conversion layer 6 that will be heated to the maximum.

Therefore, the heat diffuses in return into the structure 4 in the direction of the buried oxide layer 5 and of the bonding interface 3 (route marked by the arrows ii).

The energy conversion layer 6 is preferably produced from a material chosen from silicon oxide ($SiO_2$) and silicon nitride ($Si_3N_4$).

In the case where the active layer 14 is made of silicon, the energy conversion layer 6 may be formed, for example, by thermal oxidation of this active layer, by annealing in an oxygen-rich atmosphere, for example, at a temperature of the order of 600° C. or more, so as to obtain $SiO_2$.

In the case where the active layer 14 is made of a material other than silicon, the layer 6 may be formed by a chemical vapor deposition (CVD) technique (deposition of silicon nitride or silicon oxide).

In the case where the layer 6 is made of silicon nitride and the active layer 14 is made of silicon, the layer 6 may be obtained by nitridation of the silicon (annealing at 600° C. in a nitrogen-containing atmosphere) or else by CVD deposition.

In the embodiment, illustrated in FIGS. 1 to 5, the material constituting the active layer 14 must be transparent in the range of wavelengths provided by the laser 7, so as to allow the transfer of light toward the layer 6 (arrow i), must be a good thermal conductor, so as to enable the transfer of heat in return toward the buried oxide layer 5 (arrows ii) and must have a thickness of less than 1 µm, more preferably, between a few nanometers and 1 µm, for the two aforementioned reasons.

Moreover, the fluence of the laser 7 and the material constituting the energy conversion layer 6 are chosen so as to preferably bring the buried oxide layer 5 to a temperature above 1200° C. and to thus stabilize the bonding interface 3. Preferably, it will be ensured that neither the melting point of the oxide, for example, 1600° C. for $SiO_2$, 2000° C. for $HfO_2$ and $Al_2O_3$, nor the melting point of the active layer 14 are exceeded. Preferably, the fluence is between 0.1 J/m$^2$ and 10 J/m$^2$.

It will be noted that the illumination time of the structure is not a fundamental criterion as long as the stabilization temperature is reached. Consequently, although it is possible to use lasers other than a $CO_2$ laser, it is not essential to use much more expensive lasers, for example, short-pulse lasers. This is one advantage of the invention.

The process in accordance with the invention applies more particularly to structures for which the buried oxide layer 5 has a thickness less than or equal to 100 nm. Indeed, below this thickness, the buried oxide is too thin to absorb a significant power of the laser and it is almost not heated by the light energy flux provided by the laser 7, which passes through it to reach the energy conversion layer 6 (direction of the arrow i).

On the other hand, once the light energy is converted to heat by the layer 6, this heat may be absorbed even by an oxide layer 5 of less than or equal to 100 nm.

The invention may even apply to structures for which the buried oxide layer 5 has a thickness in the vicinity of 50 nm, or even below this value, for example, in the vicinity of 20 nm. Preferably, the buried oxide layer 5 is greater than 1 nm.

Stabilization is a microscopic phenomenon that reflects the establishment of atomic bonds (covalent bonds) between the two faces in contact, this being homogeneous over the whole of the bonding interface 3.

The non-establishment of these bonds, even very locally, may be chemically revealed by etching using a Wright etch solution (as described in publication Margaret Wright Jenkins, *Journal of the Electrochemical Society* 124, 757-759, 1977), applied for around 10 seconds.

Thus, a stabilized bonding interface inevitably has a strong bonding energy, but the opposite is not true.

Another possible embodiment of a multilayer structure, to which the stabilization process in accordance with the invention may be applied, will now be described with reference to FIGS. 6 to 9. The commons elements with the first embodiment are designated with the same references.

Figure 6:
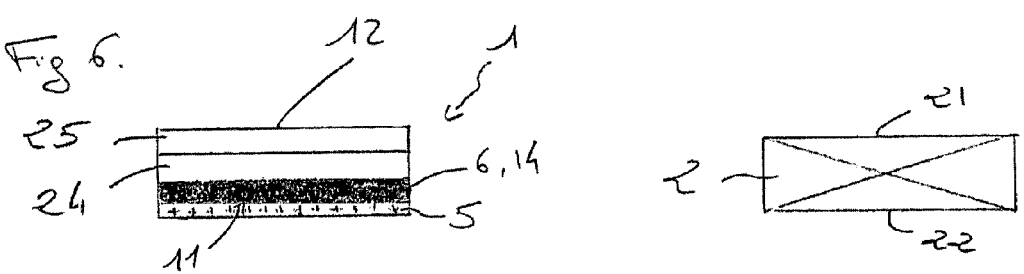
FIGS. 6, 7 and 9 schematically represent the various successive steps of another embodiment of a process for manufacturing a multilayer structure.

In FIG. 6, a donor substrate 1 can be seen, which has a front face 11 and an opposite back face 12.

This donor substrate 1 is preferably made from a semiconductor material, for example, made of silicon, germanium, silicon/germanium (SiGe) or of gallium nitride (GaN) layer, which is an active layer (14) and, on which are successively disposed, for example, a silicon oxide layer ($SiO_2$) (24) and a base (25) such as silicon.

Moreover, its front face 11 is covered with a layer of oxide 5, for example, of silicon oxide ($SiO_2$), aluminum oxide ($Al_2O_3$) or hafnium oxide ($HfO_2$). The layer 5 could also be comprised of a stack of several layers of these oxides, preferably deposited one on top of the other.

In FIG. 6, a receiver substrate 2, for example, made of sapphire, may also be seen, which has a front face 21 and an opposite back face 22. It will be noted that the receiver substrate 2 may be a single-layer or multilayer substrate.

The donor substrate 1 and the receiver substrate 2 are then bonded to one another (see FIG. 7) via molecular bonding adhesion, so that the oxide layers 5 and front face 21 come into contact with one another. The bonding interface between the two substrates 1, 2 bears the reference 3.

Figure 8:
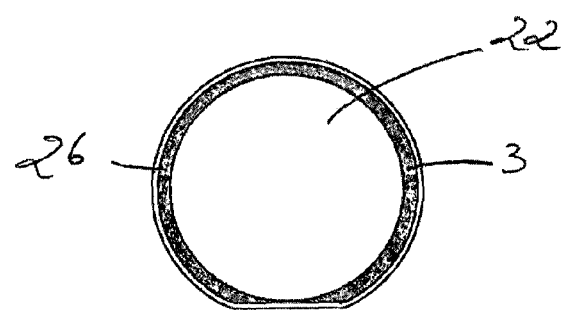
FIG. 8 schematically represents the steps of the process for stabilizing a bonding interface in accordance with the invention, applied to the multilayer structure in which the bonding interface extends between an oxide layer and a receiver substrate.
Figure 9:
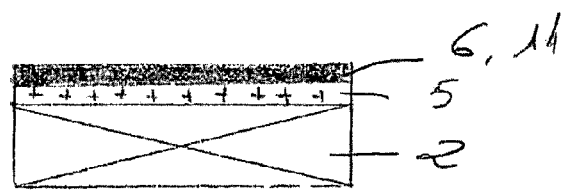

This structure is then subjected to the process for stabilizing the bonding interface 3 in accordance with the invention (FIG. 8). This process comprises a thermal stabilization step of the bonding interface 3, but because of the different thermal expansion coefficients of the two substrates bonded (1, 2) and in order to limit the stress at the bonding interface 3 during the thermal stabilization step, the structure is irradiated with a light energy flux provided by a laser, but only in a specific location (in this embodiment, on the edges 26 of the structure) so as to stabilize the bonding interface 3.

Ideally, the location that is irradiated is the one where the stress is the more important at the bonding interface 3, the stress location at the bonding interface 3 dependent upon the shape of the substrates to bond. In this embodiment described in FIGS. 6 to 9, it is known that the stress is mainly focused on the edge 26 due to circular shape substrates (1, 2).

The irradiation of only a location, like the edges 26 of the bonding interface 3, enables overcoming the different thermal expansion coefficients (CTEs) problem, and obtaining a strong and stabilized bonding interface 3 by limiting the mechanical stress, the defect and the risks of debonding.

Figure 7:
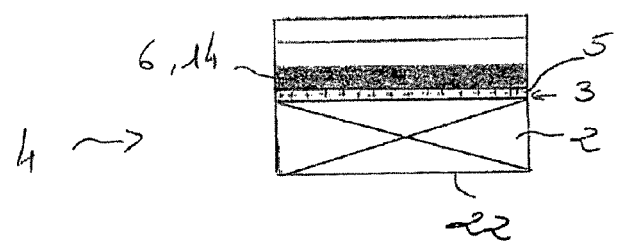

The laser 7 is moved so as to sweep the edges 26 of the receiver substrate 2 back face 22 (FIG. 7). The light energy provided by the laser 7 passes through the receiver substrate 2 and the buried oxide layer 5, and is absorbed by the active layer 14. In this embodiment, the active layer 14 and the "energy conversion" layer 6 are the same layer, so the light energy is absorbed by the energy conversion layer 6. The laser 7 passes through the buried oxide layer 5 without being absorbed because the latter is too thin.

So, after this stabilizing process (see FIG. 9), the bonding interface 3 is sufficiently strong to ensure good quality of the final layer transfer enabling detachment of the silicon oxide layer ($SiO_2$) (24) and the base (25) of the donor substrate 1 by grinding, in a manner known to a person skilled in the art, via application of mechanical and/or chemical and/or thermal stresses.

In the remainder of the description and claims, it is considered that a bonding interface is correctly stabilized, as long as, by observation using a scanning electron microscope (SEM) of the bonding interface, after etching using a Wright etch solution, over three fields, each of which extends over the entire diameter of the substrate and over a width of 3 µm, a number of defects of less than or equal to one is observed on each field.

A bonding interface that does not have any defect over the three fields will then be considered to be perfectly stabilized.

An interface having one defect per field of 3 µm in width will be considered to be weakly stabilized; it will, however, be considered to be sufficiently satisfactory for the invention.

Finally, a bonding interface having more than one defect per field of 3 µm in width will be considered to be non-stabilized.

Moreover, the oxide/oxide bonding interface 3 will be considered to be correctly stabilized if it has a resistance to etching using hydrofluoric acid (HF) at a concentration of 10% by volume, of 0.3 µm/minute, and if it has a Dit value of less than $2.10^{11}$ $cm^{-2} \cdot eV^{-1}$, and if the buried oxide layer 5 has a Qbd value of greater than 10 $C/cm^2$.

As a reminder, it is recalled that "Dit" denotes the density of traps at the bonding interface, these traps limiting the mobility of electrical carriers in the various layers, in particular, in the active layer 14. A low Dit value (less than $2.10^{11}$ $cm^{-2}$ $eV^{-1}$) is associated with a higher mobility of the carriers and, therefore, with better electrical properties of the final structure.

"Qbd" denotes the charge-to-breakdown measurement (see the standard JESD35-A—Procedure for the Wafer-Level Testing of Thin Dielectrics, April 2001).

The invention also applies to the stabilization of a bonding interface between a "buried" oxide layer and the active layer 14 or of other bonding interfaces.

In the first case, the receiver substrate 2 is covered with an oxide layer 23. The structure 4 treated, therefore, comprises a single oxide layer 23, buried between the active layer 14 and the receiver substrate 2.

The parameters for implementing the stabilization process and the criteria used for a satisfactory stabilization are the same as those described previously for the first embodiment.

The process in accordance with the invention has the advantage of being able to be easily integrated into a process for manufacturing an SeOI or SOI structure, especially when the material constituting the energy conversion layer 6 is oxide. Indeed, these manufacturing processes often integrate a step of sacrificial oxidation among the surface-finishing treatments of these structures, as is described in U.S. Pat. No. 6,403,450.

The stabilization process may, therefore, be inserted between the oxidation that makes it possible to create the energy conversion layer 6 and the removal thereof. Any possible damage caused to the layer 6 during the stabilization is of no consequence since layer 6 is subsequently removed.

Finally, since the two surfaces of the active layer 14 are protected during the illumination, the damaging thereof is not to be feared.

The invention claimed is:

1. A process for stabilizing a bonding interface located within a structure for applications in the field of at least one of electronics, optics and optoelectronics, the process comprising:

forming an energy conversion layer on an active layer of the structure, the active layer comprising a semiconductor material, the structure comprising an oxide layer buried between the active layer and a receiver substrate, the structure including a bonding interface between the active layer and the receiver substrate having been obtained by molecular adhesion; and irradiating the structure with a light energy flux provided by a laser, so that this flux, directed toward the structure, passes through the receiver substrate, through the oxide layer, and through the active layer, and is absorbed by the energy conversion layer and converted to heat in the energy conversion layer, the heat diffusing from the energy conversion layer toward the bonding interface through the active layer, and stabilizing the bonding interface by thermally treating the bonding interface without heating the oxide layer beyond a melting point of the oxide layer and without heating the active layer beyond a melting point of the active layer; wherein a fluence of the laser and a material constituting the energy conversion layer are chosen such that the buried oxide layer is heated to a temperature above 1200° C.

2. The process according to claim 1, wherein the buried oxide layer has a thickness less than or equal to 100 nm.

3. The process according to claim 1, wherein the active layer is transparent in the range of wavelengths of the light energy flux, and has a thickness of less than 1 μm.

4. The process according to claim 1, wherein the bonding interface extends between two oxide layers together constituting the buried oxide layer.

5. The process according to claim 1, wherein the irradiation of the structure comprises selectively irradiating the structure at a stressed area of the bonding interface.

6. The process according to claim 5, wherein the stressed area of the bonding interface comprises at least one edge of the conversion layer.

7. The process according to claim 6, wherein the bonding interface is between the buried oxide layer and the receiver substrate.

8. The process according to claim 1, wherein the energy conversion layer has a thermal conductivity of less than 20 W/m·K.

9. The process according to claim 8, wherein the energy conversion layer comprises a material selected from the group consisting of silicon oxide ($SiO_2$), silicon and silicon nitride ($Si_3N_4$).

10. The process according to claim 1, wherein the irradiation of the structure comprises exposing a free surface of the receiver substrate to the light energy flux, the receiver substrate being transparent in the range of wavelengths of the light energy flux.

11. The process according to claim 10, wherein the receiver substrate comprises a material selected from the group consisting of sapphire, aluminum oxide ($Al_2O_3$), aluminum nitride (AlN), silicon carbide (SiC) and quartz.

12. The process according to claim 1, wherein the laser is an infrared laser, the wavelength of which is greater than 9 μm.

13. The process according to claim 1, wherein the laser is a pulsed $CO_2$ laser.

14. The process according to claim 1, wherein the semiconductor material is silicon.

15. The process according to claim 1, wherein the buried oxide layer comprises an oxide selected from the group consisting of silicon oxide ($SiO_2$), aluminum oxide ($Al_2O_3$) and hafnium oxide ($HfO_2$).

* * * * *